(12) United States Patent
Karnezos et al.

(10) Patent No.: US 6,549,413 B2
(45) Date of Patent: Apr. 15, 2003

(54) TAPE BALL GRID ARRAY SEMICONDUCTOR PACKAGE STRUCTURE AND ASSEMBLY PROCESS

(75) Inventors: Marcos Karnezos, Palo Alto, CA (US); Yong-Bae Kim, Song-Pa-Goo (KR)

(73) Assignee: ChipPAC, Inc., Fremont, CA (US)

( * ) Notice: Subject to any disclaimer, the term of this patent is extended or adjusted under 35 U.S.C. 154(b) by 0 days.

(21) Appl. No.: 10/082,914

(22) Filed: Feb. 26, 2002

(65) Prior Publication Data

US 2002/0127778 A1 Sep. 12, 2002

Related U.S. Application Data

(60) Provisional application No. 60/272,238, filed on Feb. 27, 2001.

(51) Int. Cl.⁷ ................................................. H05K 7/20
(52) U.S. Cl. ...................... 361/704; 165/80.2; 165/185; 174/16.3; 174/252; 257/712; 257/738; 257/774; 257/780; 361/705; 361/707; 361/708; 361/717; 361/719; 438/108; 438/122
(58) Field of Search ............................... 165/80.2, 80.3, 165/185; 174/16.3, 252; 257/706–707, 712–713, 737–738, 774, 779–780, 684; 438/15, 25–26, 108, 122; 361/704–705, 707–708, 710, 717, 718, 719–720, 749, 722

(56) References Cited

U.S. PATENT DOCUMENTS

| | | | |
|---|---|---|---|
| 5,397,921 A | 3/1995 | Karnezos | |
| 5,409,865 A | 4/1995 | Karnezos | |
| 5,650,662 A | * 7/1997 | Edwards et al. | ............ 257/712 |
| 5,851,337 A | 12/1998 | Chen | |
| 5,877,552 A | 3/1999 | Chiang | |
| 5,905,634 A | 5/1999 | Takeda et al. | |
| 5,933,324 A | 8/1999 | Barrett | |
| 5,977,626 A | 11/1999 | Wang et al. | |
| 6,020,637 A | 2/2000 | Karnezos | |
| 6,146,921 A | 11/2000 | Barrow | |
| 6,323,065 B1 | 11/2001 | Karnezos | |
| 6,400,014 B1 | 6/2002 | Huang et al. | |

OTHER PUBLICATIONS

Tetsuo Kida, Takashi Haruta, and Takashi Yoshioka, "Improving Dry–Film Adhesion," Optoelectronics Manufacturing Conference, Jul. 2001.

* cited by examiner

*Primary Examiner*—Gregory Thompson
(74) *Attorney, Agent, or Firm*—Bill Kennedy; Haynes Beffel & Wolfeld LLP

(57) ABSTRACT

A package structure includes a heat spreader, a ground plane affixed to the heat spreader, and a flex tape interconnect substrate affixed to the ground plane. An aperture in the ground plane reveals a die attach surface on the heat spreader, and an aperture in the flex tape interconnect structure is aligned with the ground plane aperture such that the aligned apertures together with the revealed ground plane surface define a die cavity. The aperture in the ground plane is formed so as to form aperture walls substantially perpendicular to the ground plane. According to the invention the heat spreader, the ground plane, and the flex tape interconnect substrate have specified characteristics. Particularly, the heat spreader is provided as a metal sheet or strip, usually copper, having a "velvet type" oxide, usually a velvet black copper oxide, on at least the surface of the heat spreader to which the ground plane is to be affixed. And particularly, the ground plane is provided as a metal sheet or strip, usually copper, having a gray oxide or, more preferably, a velvet type oxide, usually a velvet black copper oxide, on both upper and lower surfaces. A velvet type oxide is preferred because it provides excellent adhesion to adhesives employed in lamination of the ground plane onto the heat spreader, and to encapsulation materials.

20 Claims, 6 Drawing Sheets

TAPE BALL GRID ARRAY SEMICONDUCTOR PACKAGE STRUCTURE AND ASSEMBLY PROCESS

CROSS REFERENCE TO RELATED APPLICATION

This application claims priority from Provisional Application No. 60/272,238, filed Feb. 27, 2001.

BACKGROUND

This invention relates to high performance semiconductor device packaging.

Semiconductor devices increasingly require lower cost packaging with higher thermal and electrical performance. A common package used for high performance devices is the Ball Grid Array ("BGA"). The BGA is a surface mount package that can provide higher thermal and electrical performance, and a lower thickness profile and a smaller footprint, as compared to lead frame based surface mount packages. Improvements are sought in the structure and design of the package, to provide increased thermal and electrical performance and to maintain the established footprint and thickness characteristics of standard BGAs.

Ball grid array assembly semiconductor packages and methods for manufacturing them are described, for example, in U.S. Pat. No. 5,397,921, in U.S. Pat. No. 6,020,638 and in U.S. Pat. No. 6,323,065, hereby incorporated by reference.

A BGA package as described in U.S. Pat. No. 5,397,921 includes a heat spreader having a cavity, typically defined by etching, for receiving the semiconductor die; and an interconnect substrate affixed to the heat spreader, and having an aperture arranged over the opening of the die cavity. The interconnect substrate is a "flex tape", which includes a patterned metal routing layer for electrically interconnecting the semiconductor die to electrical connections external to the semiconductor package.

A package as described in U.S. Pat. No. 6,323,065 includes a heat spreader, a ground plane affixed to the heat spreader, and a flex tape interconnect substrate affixed to the ground plane. An aperture in the ground plane defines a path to the surface of the heat spreader. The interconnect substrate, which may have more than one patterned routing layer, is also provided with an aperture, arranged over the ground plane aperture, so that the aperture walls and the heat spreader surface enclosed within them define a cavity for receiving the semiconductor die. The package is constructed by attaching the ground plane to the heat spreader, using a layer of adhesive which is first attached to the ground plane and then to the heat spreader; attaching the flex tape interconnect substrate onto the ground plane, using a layer of adhesive which is first attached to the flex tape interconnect substrate and then to the ground plane; attaching the semiconductor die onto the heat spreader within the ground plane die aperture, using a die attach epoxy; electrically connecting the semiconductor die to bond sites on the ground plane and on the interconnect substrate; filling the cavity with an encapsulation material to protect the die and the wire bonds from the environment and to provide mechanical protection; and positioning solder balls in vias configured for connection to metal routing layers in the interconnect substrate or to the ground plane.

SUMMARY

Generally, the package structure according to the invention includes a heat spreader, a ground plane affixed to the heat spreader, and a flex tape interconnect substrate affixed to the ground plane. An aperture in the ground plane reveals a die attach surface on the heat spreader, and an aperture in the flex tape interconnect structure is aligned with the ground plane aperture such that the aligned apertures together with the revealed ground plane surface enclosed by the ground plane aperture define a die cavity.

In one general aspect the aperture in the ground plane is formed so as to be substantially perpendicular to a ground plane surface. According to the invention the heat spreader, the ground plane, and the flex tape interconnect substrate have specified characteristics.

Particularly, in one general aspect of the invention the heat spreader is provided as a metal sheet or strip, usually copper, having a "velvet" type oxide, usually a velvet black copper oxide, on at least the surface of the heat spreader to which the ground plane is to be affixed. According to the invention, a velvet type oxide is preferred because it provides excellent adhesion to die attach epoxies, to encapsulation materials and to adhesives employed in lamination of the ground plane onto the heat spreader.

In another general aspect of the invention the ground plane is provided as a metal sheet or strip, usually copper, having a gray oxide or, more preferably, a velvet type oxide, usually a velvet black copper oxide, on both upper and lower surfaces. Again, according to the invention, a velvet type oxide is preferred because it provides excellent adhesion to adhesives employed in lamination of the ground plane onto the heat spreader, and to encapsulation materials.

In some embodiments the flex tape interconnect structure includes a two-layer tape; in other embodiments the flex tape interconnect tape includes a three-layer tape. In some embodiments the flex tape interconnect structure includes conductive traces formed from one metal layer; in other embodiments the flex tape interconnect structure includes conductive traces formed from at least two metal layers.

In another general aspect the invention features a method for forming a plurality of packages, by providing a metal heat spreader strip, a metal ground plane strip, and a flex tape interconnect structure, in which the metal strips and the tape are dimensioned so that several individual packages are constructed together on the strip and then are singulated to make the several individual packages. The strips and the tape each are provided with an opening for each of the several packages. The ground plane is laminated onto the heat spreader to form a heat spreader—ground plane assembly. Slots are formed in the laminated heat spreader ground plane assembly, so that each of the four edges of a package is defined by a slot, and so that each package remains connected to the strip by its four corners, referred to as "ears". The tape interconnect substrate is laminated onto the ground plane. The openings in the ground plane and the interconnect substrate are aligned so that the walls of each opening together with the part of the underlying heat spreader that is exposed within them constitutes a die cavity. A die is attached in the cavity. Wire bonds are formed from the die to bond fingers at selected contact points on conductive traces in the interconnect structure. The die and the wire bonds are encapsulated. Solder balls are attached to ball pad sites on conductive traces in the interconnect structure. Then the "ears" are severed at the corners of the individual packages to singulate the packages.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the Figs. illustrating embodiments of the invention, elements corresponding to elements shown in other drawings are not all particularly renumbered, although they are all readily identifiable in all the Figs.

Figure 1:
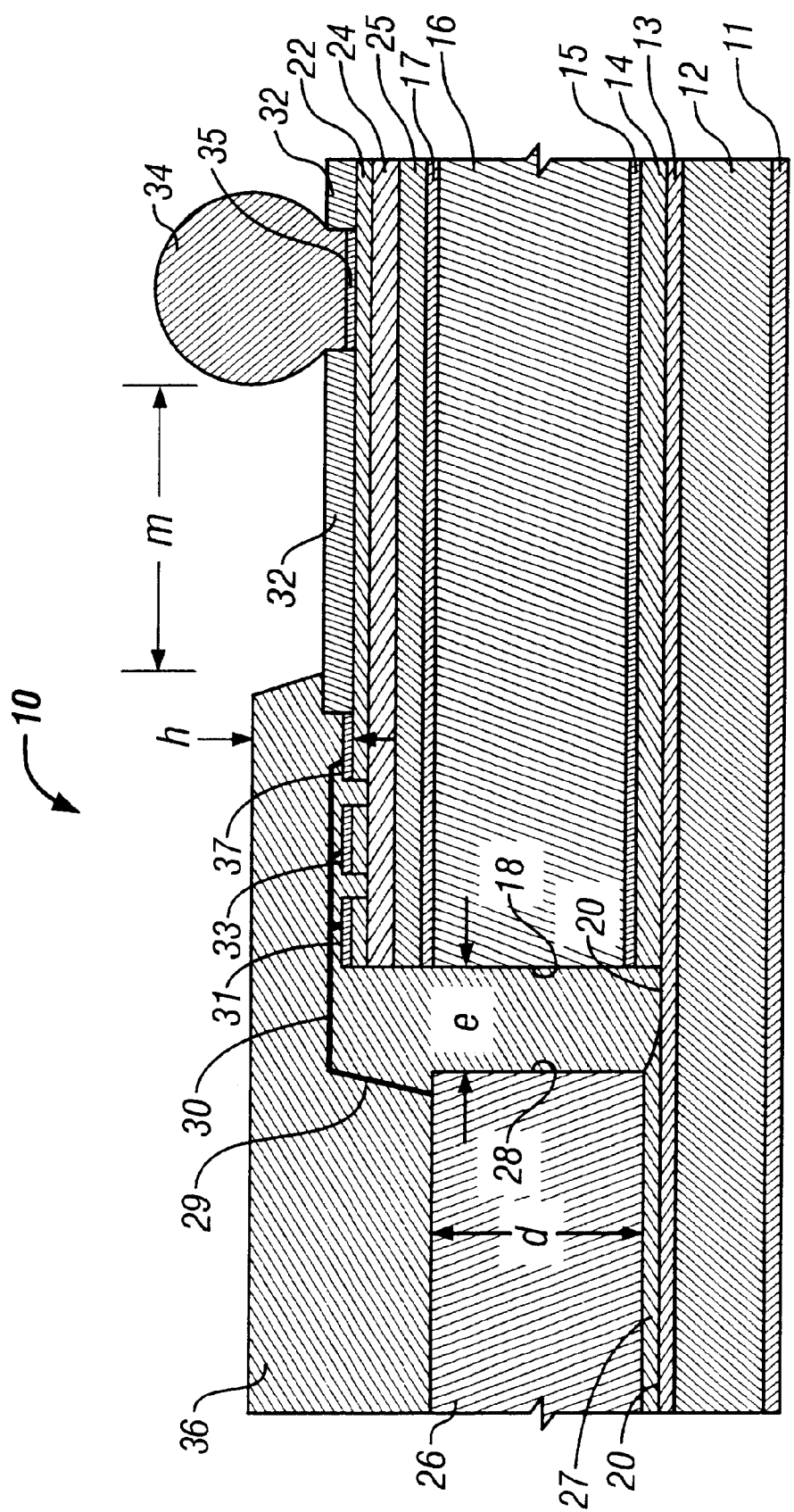
FIG. 1 is a diagrammatic sketch in a sectional view showing a portion of a tape ball grid array according to an embodiment of the invention.

Turning now to FIG. 1, there is shown diagrammatically in a sectional view a portion of a tape ball grid array construct according to one embodiment of the invention.

A semiconductor package as illustrated in FIG. 1 can be constructed generally as follows. A metal heat spreader strip, a metal ground plane strip, and a flex tape interconnect structure are provided. The strips and the tape are dimensioned so that several packages (four or five, for example) are constructed together in a row on the strip, and then are singulated to make the several individual packages. The strips and the tape are provided with openings, configured and dimensioned so that when the ground plane and tape are laminated onto the heat spreader, the openings form a die cavity for each of the individual packages, as described in more detail below. The ground plane is laminated onto the heat spreader. Slots are formed in the laminated heat spreader and ground plane assembly, so that each of the four edges of a package is defined by a slot, and so that each package remains connected to the strip by its four corners (referred to as "ears"). The tape interconnect substrate is laminated onto the ground plane.

At this juncture, the openings in the ground plane and the interconnect substrate are aligned so that the walls of each opening together with the part of the underlying heat spreader that is exposed within them constitutes a die cavity. A die is attached in the cavity. Wire bonds are formed from the die to bond fingers at selected contact points on conductive traces in the interconnect structure. The die and the wire bonds are encapsulated. Solder balls are attached to ball pad sites on conductive traces in the interconnect structure. Then the "ears" are severed at the corners of the individual packages to singulate the packages.

Referring still to FIG. 1, the heat spreader consists of a copper strip 12, preferably treated to provide a copper oxide layer over one surface 13 or both surfaces 13 and 11. The copper oxide layer 13 or layers 13, 11 are preferably a black oxide known as the "velvet" type. The velvet black oxide is microscopically rough, and on a surface 13 the velvet black oxide can provide superior adhesion to a structure affixed onto it and, particularly, the velvet black oxide can according to the invention provide superior adhesion of the die attach material that is employed in affixing the die onto the heat spreader surface within the die cavity; and the velvet black oxide can provide improved adhesion with the adhesive employed in attaching the ground plane to the heat spreader. Usually the velvet black oxide layer has a thickness about 3–4 microns. "Velvet" oxides are characterized by showing marks or fingerprints where they have been contacted. This characteristic can be disadvantageous on the surface 11 of the heat spreader, which constitutes an external surface (usually termed the "upper" surface) of the package; accordingly, where velvet black oxide is provided on the surface 11 of the heat spreader, typically the surface is treated by application of a coating such as an epoxy black ink, usually 10–25 microns thick, selected to be suitable for application of markings and labels. Although it is possible in principle to provide a heat spreader having the velvet black oxide on only the surface 13, in practice a routine process of forming the velvet black oxide results in treatment of both surfaces.

Still with reference to FIG. 1, the ground plane consists of a copper strip 10, preferably treated to provide a copper oxide layer over surfaces 15 and 17 for improved adhesion with adjacent layers. Adhesives commonly used for lamination in chip packages adhere poorly to copper, and Laminates using adhesives on untreated copper surfaces tend to delaminate, resulting in reduced reliability and lower Resistance to Moisture Test levels. The copper oxide layers 15 and 17 may be a gray oxide (usually about 1–2 microns thick), but are according to the invention more preferably a velvet black oxide, to provide improved adhesion with the heat spreader on the one side 15 and with the tape interconnect structure on the other side 17. Preferably, the ground plane strip 16 is provided with an adhesive layer 14 (preferably a curable epoxy adhesive) on the surface 15 that is to be laminated to the heat spreader oxide surface 13. Windows are removed from the ground plane strip 16, one window for each individual package, dimensioned and configured to form a cavity for the die. The windows may be removed by any fabrication method, but usually the windows are either mechanically punched or chemically etched from the strip. Whatever technique is employed, it is important that the window be dimensioned with some precision, and that the window walls 18 defining the sides of the die cavity be substantially perpendicular to the ground plane, because that provides for placement of the die very near the cavity walls with low risk of contact of the die with the wall at any point. Chemical etching of copper is isotropic, and etching from one surface of a sheet can result in nonplanar and nonperpendicular walls as well as sharp edges. A cavity formed by a ground plane opening having sharp edges can produce stress concentration, potentially causing cracking of the encapsulation and degradation of package reliability. However, because according to the invention the window is formed in the ground plane prior to lamination of the ground plane to the heat spreader, it is possible to etch from both surfaces of the strip, providing perpendicularity of the walls to a good approximation and avoiding sharp edges. Selection of a technique for forming the windows is done according to general manufacturing principles; non-recurring expenses are generally lower for an etch technique than for a mechanical punch technique, while the unit cost of the mechanical punch technique is lower. Accordingly, an etch technique may be preferred where a lower volume of packages is to be made, and a punch technique may be preferred where a higher volume of packages is to be made. Where the ground plane copper strip 16 is provided with adhesive layer, the window will be formed through the adhesive layer as well as through the copper strip.

The ground plane is laminated onto the heat spreader by contacting the adhesive layer 14 onto the heat spreader velvet black oxide surface 13 and applying a suitable pressure and concurrently suitably raising the temperature of the adhesive layer for a period of time sufficient to cure the adhesive and leave substantially no voids in the cured adhesive layer 14.

Figure 6A:
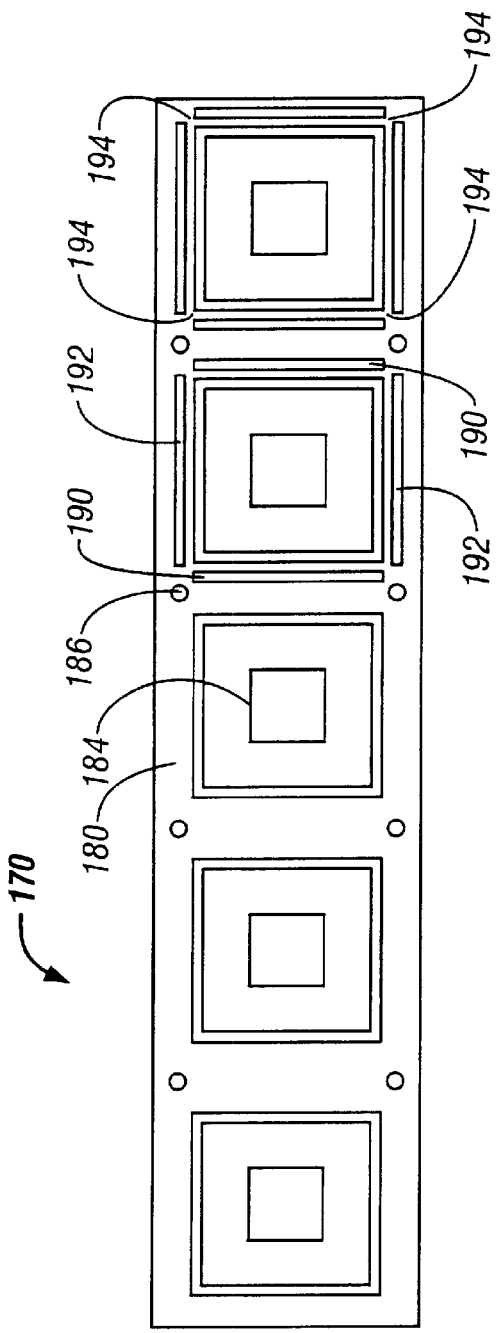
FIGS. 6A and 6B are diagrammatic sketches in a plan view showing stages in a tape ball grid array singulation process according to the invention.
Figure 6B:
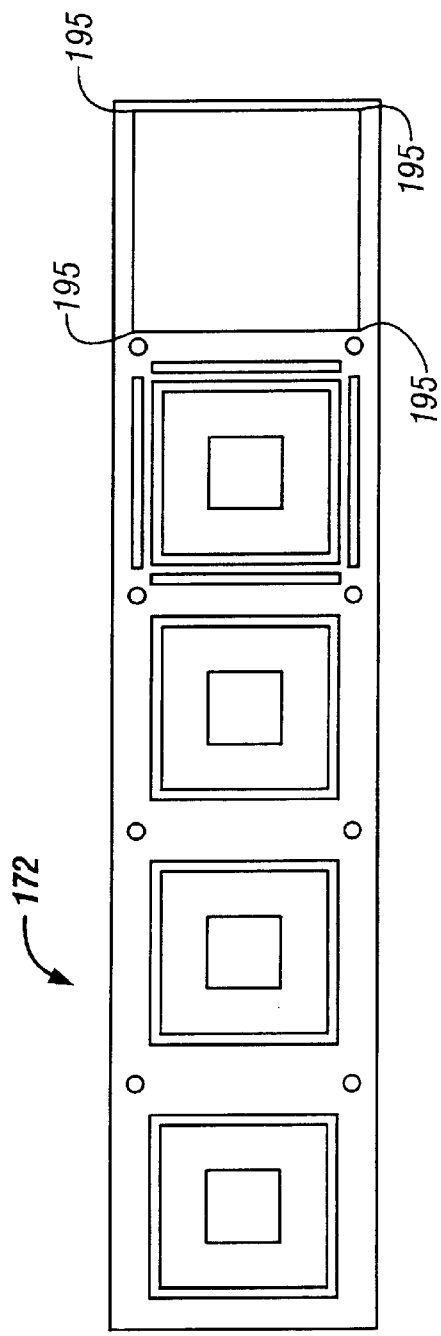

The formation of the singulation slots in the laminated ground plane and heat spreader assembly is described in more detail below, particularly with reference to FIGS. 6A and 6B.

The flex tape interconnect structure includes a flex substrate polymer layer 24, such as a polyimide layer, having a circuit formed on one surface. The tape may be formed by providing on one surface a metal (for example copper) layer 22, and then patterning the metal layer by conventional masking and etching to form conductive traces according to the particular routing circuitry desired. A solder mask 32 is formed over the conductive traces, and provided with openings exposing solder ball pad sites 35, and exposed wire bond fingers, for example 31, 32, 37. A nickel-gold plating is formed over all the exposed parts of the conductive traces. A conventional plating process may be employed, resulting in a nickel layer approximately 3–4 microns thick over the conductive trace, and a gold layer approximately 0.5 microns thick over the nickel layer. This nickel gold plating is preferred for wire bonding; and the gold portion of the nickel-gold layer in the solder ball pads is a sacrificial layer that migrates into the solder during the solder ball attachment process, as is discussed in more detail below.

The flex tape interconnect structure is laminated onto the ground plane by contacting the adhesive layer 25 (preferably a curable epoxy adhesive) onto the oxide surface 17 of the ground plane and applying a suitable pressure and concurrently suitably raising the temperature of the adhesive layer for a period of time sufficient to cure the adhesive and leave substantially no voids in the cured adhesive layer 25. Typically the pitch of the openings and traces on the flex tape does not match the pitch of the corresponding features on the ground plane strip and, accordingly, the interconnect structures for the individual packages are in most instances singulated prior to their alignment over the ground plane strip and subsequent adhesive curing.

The die 26 is then attached within the die cavity by dispensing a suitable measured quantity of die attach material, typically a die attach epoxy, into the center of the die attach surface 20 on the velvet black oxide 13 that is exposed within, and bounded by, the cavity walls 18; aligning the die 26 within the cavity and pressing it onto the die attach material, so that the die attach material flows laterally over the die attach surface 20 to the die edge; and curing the die attach material so that it forms a die attach layer 27 substantially free of voids, and finishes with a fillet at the lower edge of the side 28 of the die. It is desirable to minimize the spacing between the die and the cavity walls, in order to minimize the lengths of the wire bonds. Accordingly, care is taken to keep the spacing (e in the FIGS.) between the sides of the die and the walls of the die cavity within a range of tolerance to ensure that the die is as close as is practicable to the wall while ensuring that at no point is the die in contact with or too close to the cavity wall. The particularly good adhesion that the velvet black oxide of the heat spreader provides with the cured die attach material makes the attachment of the die to the heat spreader according to the invention particularly robust and resistant to delamination. Preferably, the depth of the cavity from the die attachment surface 20 to the surface 17 of the ground plane approximates the thickness (d in the Figs.) of the die.

Because the window is formed in the ground plane prior to lamination of the ground plane onto the heat spreader, the planar surface of the heat spreader provides a flat floor for the die cavity. As a result the die attach material can have a uniform thickness across the full dimension of the die, providing uniform distribution of stresses and a more robust package, less liable to delaminate.

Conventional wire bonds 30 are employed, connected 29 to the die 26 and to bond fingers on the conductive traces in the interconnect tape using a standard gold wire thermosonic process. In the embodiment shown in FIG. 1, bond fingers are shown for a trace to ground 31, for a trace to power 33, and for an input/output trace 37. As will be appreciated, separate wire bonds 30 would be employed for these various connections.

Encapsulation is carried out by a standard process. Generally, a sacrificial bead or dam is formed on the surface of the solder mask 32 to define the perimeter of the encapsulation, and then an encapsulation material, typically an encapsulation epoxy, is dispensed to fill all the spaces enclosed by the dam: the spaces within the cavity, including the channel surrounding the die between the die and the walls of the cavity; the surface of the die; the wire bonds and the parts of the tape interconnect structure not covered by the solder mask. Then the encapsulation material is cured. The dam is formed high enough that the resulting encapsulation will have a height (h in the Figs.) over the bond fingers that is within a desired range sufficient to ensure good protection for the wire bonds, typically no greater than 100 microns from the surface of the conductive trace surface on the tape. Additionally the dam is positioned on the solder mask so that the resulting encapsulation will to some extent overlap the edge of the solder mask, to ensure a robust seal at the edge, and spaced apart from the nearest adjacent solder balls by a distance (m in the Figs.) within a range, typically up to about 0.5 mm.

Solder balls 34 are attached onto contact pads in the tape circuit (or to the ground plane) by dispensing a suitable solder flux onto the nickel-gold plated ball pad sites 35 (or in vias running to the ground plane), positioning the balls at the sites in a pick-and-place operation, and reflowing the solder by application of heat through a standard reflow temperature cycle in a reflow oven. Then any remaining flux is cleaned from the package.

Figure 2:
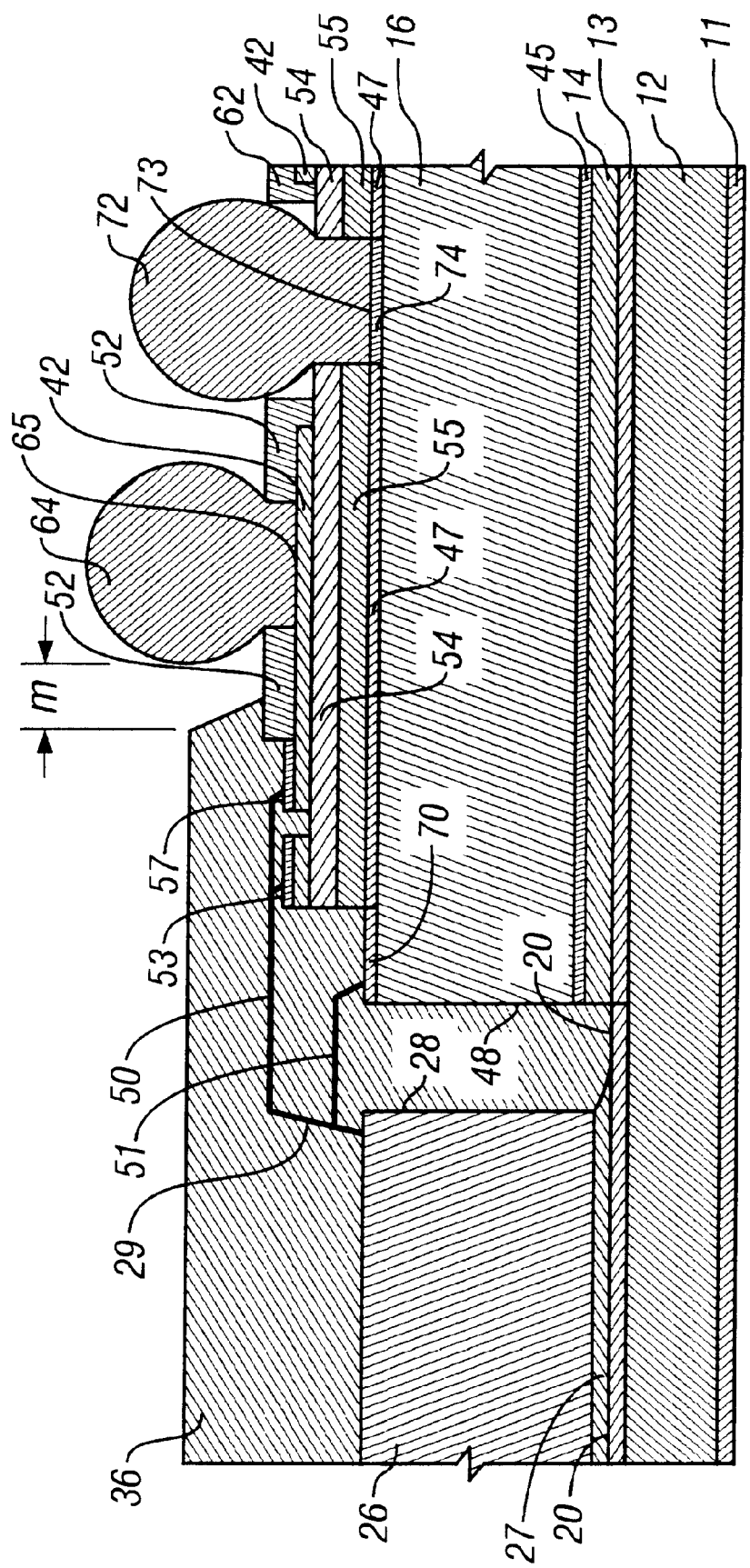
FIG. 2 is a diagrammatic sketch in a sectional view showing a portion of a tape ball grid array according to another embodiment of the invention.

FIG. 2 shows diagrammatically in a sectional view a portion of a tape ball grid array construct according to another embodiment of the invention. This embodiment is similar to the embodiment of FIG. 1 in many respects, and the following description addresses principally the differences between the embodiments. Particularly there are differences in the structures of the ground plane and the tape interconnect structure, and differences in the assembly process.

In the embodiment of FIG. 2 the ground plane is formed of a copper strip 16, treated to provide a copper oxide layer (preferably a velvet black oxide) over the surfaces 45 and 47. Here, however, selected sites in the ground plane surface 47 are provided with silver plated pads 70, near the die cavity wall 48, to which a wire bond connection 51 may be made from the die to ground, and 74, to which a ground ball may be attached through a via in the tape interconnect structure. Silver is selected as a plating for the pads 70, because silver is suitable for wire binding. The silver plating at the ground ball pads is a sacrificial layer, which protects the underlying copper 16 from oxidation during earlier steps in the process, and which migrates into the solder ball during the reflow process, providing good electrical contact of the reflowed ball with the underlying metallic copper. As in the embodiment of FIG. 1, plasma cleaning of the ground strip can remove any silver surface contamination that may result from the oxide growth process, ensuring high yield and high reliability wire bonding on the ground ring 70 and good solder wetting of the silver plated ground ball pads on the ground plane.

In the embodiment of FIG. 2 the tape interconnect structure has large vias overlying the sites where ground balls 72 are to be attached to the ground ball pad surfaces 73 on the silver plated sites 74 in the ground plane surface 47. And, in the embodiment of FIG. 2 the tape interconnect structure has larger openings over the die cavity, so that when the tape is aligned over the ground plane a marginal portion of the ground plane near the die cavity wall 48, on which the silver plated pads 70 are located, is revealed so that the wire bond connections 51 to ground may be made there. The silver plated pads are preferably dimensioned so that they are not overlapped by the edge of the tape adhesive 55, to avoid interference with good adhesion of the tape to the ground plane. And the silver plating can be segmented and interspersed with areas of gray or, more preferably, black oxide to provide for better adhesion of the encapsulant at the ground ring.

The tape interconnect structure in the embodiment of FIG. 2 includes a flex substrate polymer layer 54, such as a polyimide film, provided on one surface with circuitry 42, which is covered with a patterned solder mask 62. The polyimide film has a thickness usually in the range 25–100 microns, for example about 75 microns thick. The flex tape can be a "two-layer" tape, in which the copper making up the conductive traces is formed directly onto the polyimide film; or can be a "three-layer" tape, in which the copper is attached to the polyimide film by an adhesive. An adhesive layer 55 is provided on the surface of the polymer layer opposite the conductive traces, The adhesive layer has a thickness usually in the range about 25–50 microns. Openings in the solder mask reveal sites, for example 65 on the conductive traces 42, for attachment of input/output balls and power balls, as for example ball 64; and wire bond fingers 53, 57 for attachment of wire bonds such as wire bond 50 from the die to power traces or input/output traces.

The construction of the ground vias and the ground via filling process are better described with reference to the enlarged view in FIG. 3.

Figure 3:
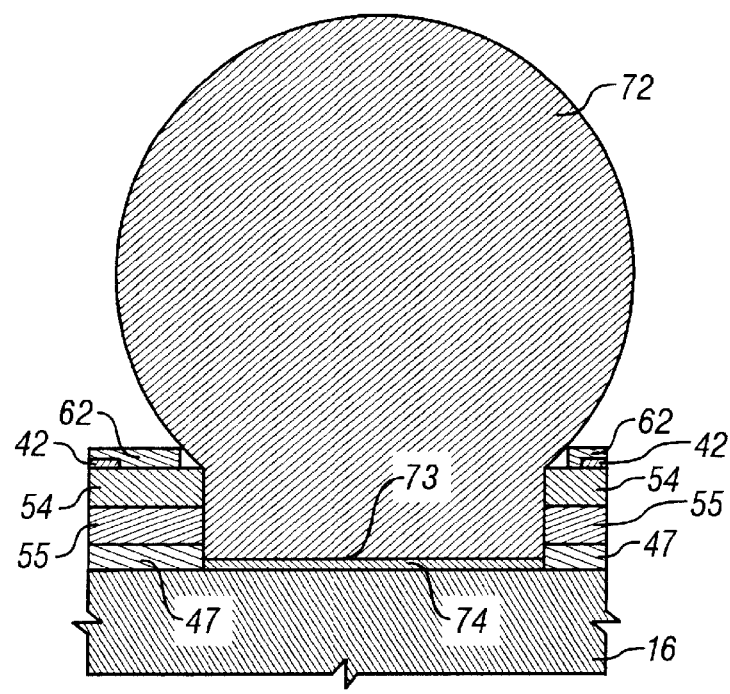
FIG. 3 is a diagrammatic sketch in a sectional view showing a detail of a ground via as in the embodiment of FIG. 2.

Particularly, the ground via construction of the embodiment of FIGS. 2 and 3 can be formed in the flex tape substrate by punching the via through the polyimide layer 54 and tape adhesive layer 55 only. The metal tracing 42 is patterned to stop some distance apart from the via, and is separated from the solder ball by the solder mask 62 which is also formed so as not to be too near the region of the via. Keeping the metal tracing 42 away from the via is advantageous because the presence of copper prevents diffusion of gases, generated in the adhesive during the solder paste reflow process, to the ambient and can thereby cause formation of voids in the via which reduce ball shear and reliability. Keeping the solder mask 62 away from the region of the via is advantageous because the solder mask material tends to crack during the ground via punch process, and the cracked solder mask can delaminate during subsequent reliability testing. Similarly it can be advantageous to form the solder mask somewhat smaller than the package body, so that the solder mask stands away from the edge of the body. This avoids the possibility of cracking of the solder mask during the tape singulation process.

And particularly, in a preferred process for filling the ground vias, the appropriate quantity of solder paste in dispensed into the via by a screen printing process, and is followed by a reflow to fill the via with solder. The reflow process used for filling the vias can be the same as that used for the subsequent solder ball reflow. Preferably, the temperature cycle for the process employs a short duration high temperature spike, usually less than about 10 seconds, at a temperature usually greater than about 240° C. This short high temperature spike avoids excessive outgassing of the tape adhesive that might result from a longer high temperature cycle, and that can cause solder ball voids. The amount of solder paste in the via is controlled by the diameter and thickness of the stencil, so that the molten solder forms a meniscus level even with the polyimide tape surface.

Figure 4:
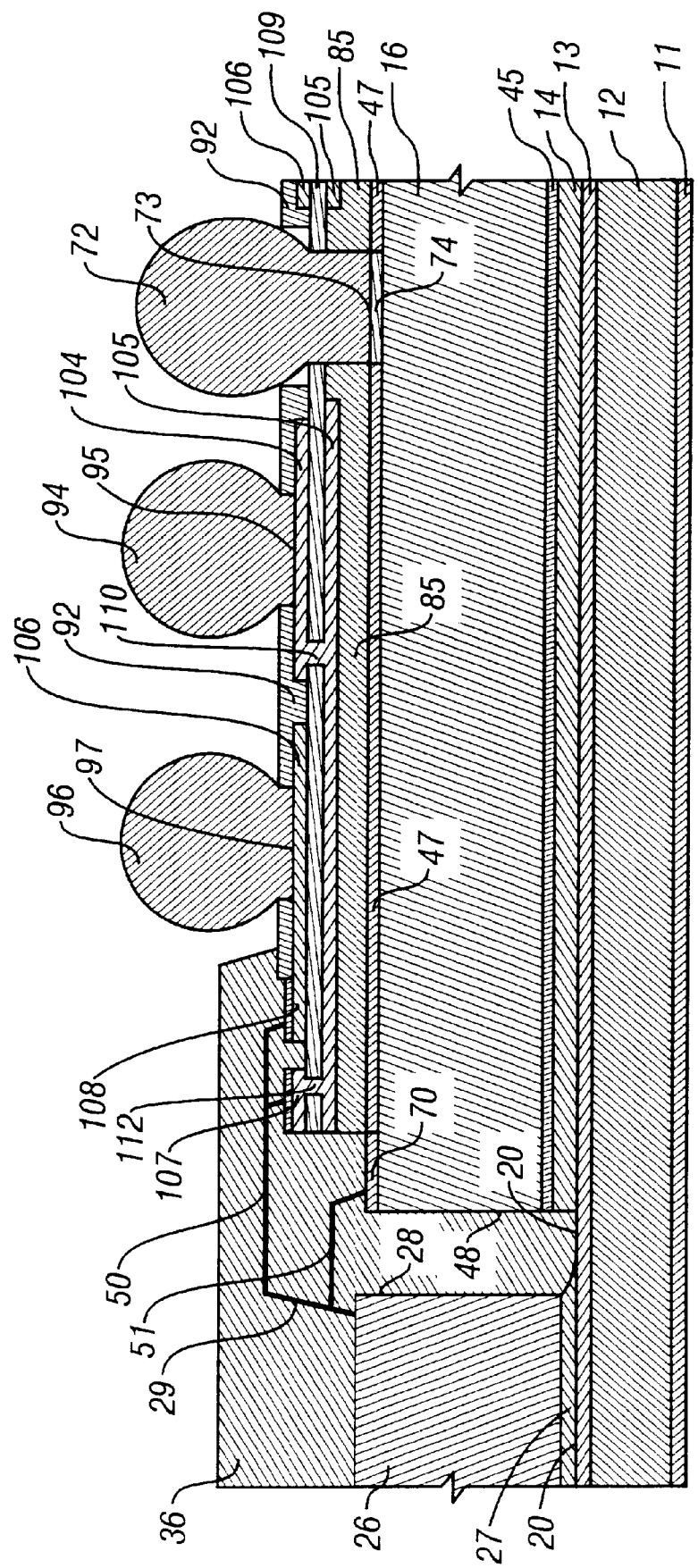
FIG. 4 is a diagrammatic sketch in a sectional view showing a portion of a tape ball grid array according to another embodiment of the invention.

FIG. 4 shows diagrammatically in a sectional view a portion of a tape ball grid array construct according to yet another embodiment of the invention. This embodiment is similar to the embodiment of FIG. 2 in many respects, and the following description addresses principally the differences between the embodiments. Particularly there are differences in the flex tape interconnect substrate and, accordingly, in the construction of interconnects.

Referring now to FIG. 4, the heat spreader and ground plane are constructed substantially the same as in the embodiment of FIG. 2. The tape in the embodiment of FIG. 4 has two metal layers separated by the flex polymer substrate (such as a polyimide film) and patterned and connected at selected points through the polymer to form the required routing. Thus the two-metal tape includes a polymer layer 109 having patterned metal (for example copper) layers forming conductive traces 105, 106 on both surfaces and having vias, for example 110, permitting connection between the two patterned layers at selected points. On the side of the tape that is to be laminated onto the oxide surface 47 of the ground plane 16, the tape is provided with an adhesive layer 85. On the opposite side of the tape is a solder mask layer 92. A ground ball 72 is connected through a ground via to a ground pad 73 on a ground site 74 on the ground plane 16. A power ball 94 is connected at a connection site 95 to a trace formed in metal layer 104, which is connected through a via 110 to a trace formed in metal layer 106 that runs toward the center of the package, where it connects through a via 112 to an isolated portion of metal layer 104 that constitutes a wire bond finger 107 for wire bond connection of the die to power. Similarly, an input/output ball 96 is connected at a connection site 97 to a trace 106 formed in metal layer 104 that runs toward the center of the package where it ends at a wire bond finger 108 for wire bond connection of the die.

Figure 5:
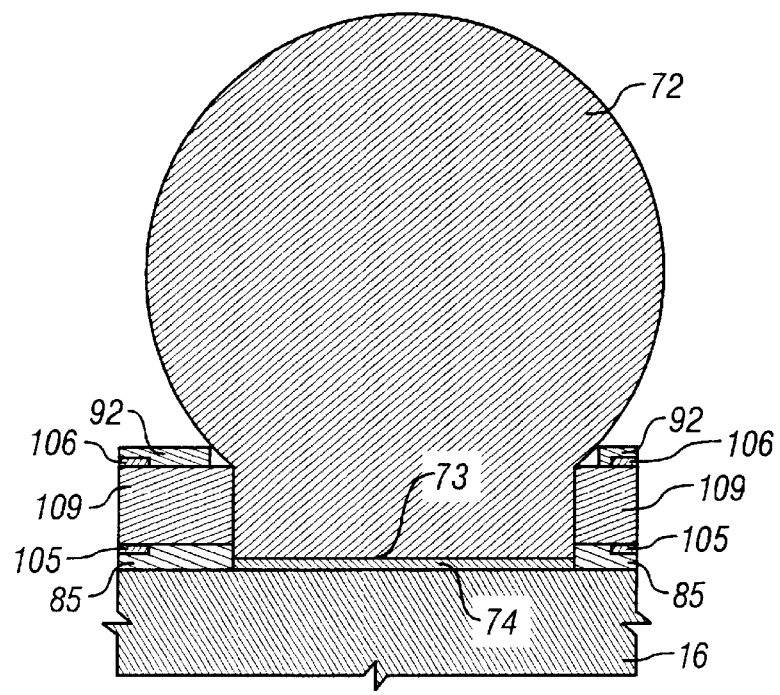
FIG. 5 is a diagrammatic sketch in a sectional view showing a detail of a ground via as in the embodiment of FIG. 2.

The construction of the tape at the solder ball via may be better understood by reference to FIG. 5. The conductive traces formed in metal layers 105, 106 are supported on, and are separated from one another by, the polymer substrate layer 109, which may have a thickness about 50 microns. The metal layer 105 is insulated from the adjacent ground plane 16 by the layer of adhesive 86, and the metal layer 106 is protected from ambient by solder mask layer 92. In the region of the ground via the metal layers 105, 106 are patterned so that they stop some distance apart from the via; and the solder mask 92 is also formed so as not to be too close to the via. As described above with reference to FIG. 3, providing a standoff between the metal (copper) and the via ensures that the metal can not intrude into the via, where it could induce gas formation that would interfere with proper solder reflow; and keeping the solder mask some distance away from the via region avoid cracking of the solder mask during the via punch through.

In this embodiment of the invention the bottom layer copper circuitry is recommended for routing the input/output of the chip to the solder balls. Advantageously, a polyimide layer 50 microns thick in combination with the top copper layer of the tape allows formation of a microstrip structure of 50 Ohm controlled impedance for the input/output circuit traces. The top copper layer preferably is employed for power connections and partially for input/output connections. The thin 50 micron adhesive layer between the ground plane and the heat spreader allows the formation of a very large capacitance, which is desirable for the power circuit of the chip.

Also advantageously in this embodiment the routing of tape circuit layers is designed to maximize electrical performance and to allow the maximum possible number of bond fingers connected to solder pads. In preferred implementations the inner row of solder balls is employed for power connections. The short traces provide for the minimum inductance connections, as is desirable for the power circuit. The outer row of solder balls is employed for ground connections on the ground plane. Shorting all the ground balls and connection on the ground plane provides a very low inductance ground circuit, which is desirable for high electrical performance. Moreover, this eliminates long traces from the chip, which is also desirable for high frequency operation. Additionally elimination of these traces allows muting of additional bonding fingers for chip with higher I/O. The remaining balls are employed for I/O connections.

Figure 7A:
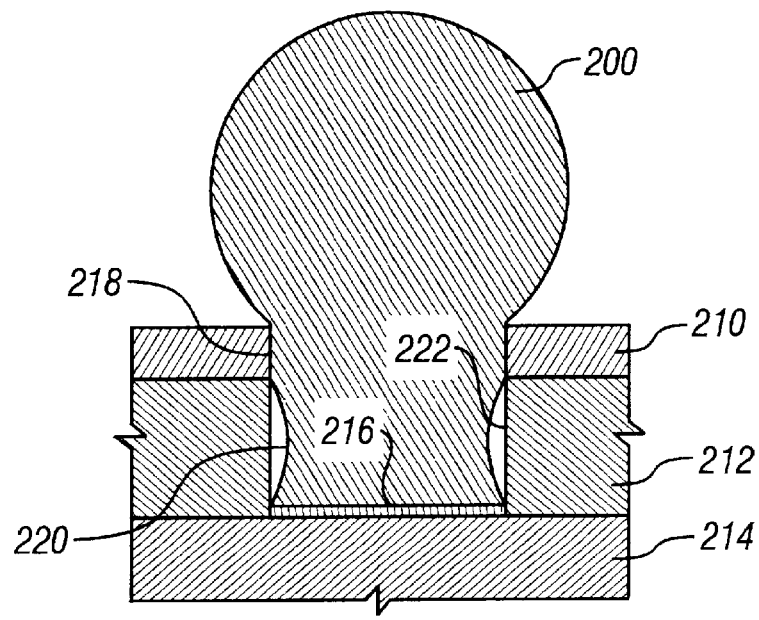
FIG. 7A is a sketch in a diagrammatic sectional view thru a solder ball attached to a superficial metal trace.
Figure 7B:
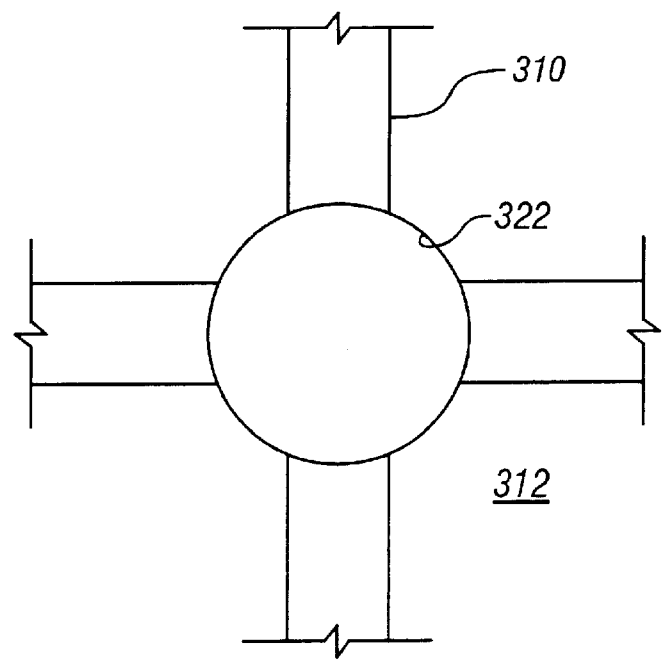
FIG. 7B is a sketch in a plan view showing an arrangement for a superficial metal trace near a solder ball via according to the invention.

In some circumstances it may be desirable to provide connection between a ground ball and a superficial conductive trace. In such a case, it is preferred according to one aspect of the invention not to surround the superficial portion of the via entirely with the metal trace. Instead, the metal trace is brought to the via in segments (as, for example, spokes radiating from the via) so that less than the entire periphery (usually less than about half) of the via is covered by metal. This is illustrated in FIGS. 7A and 7B. Referring now to FIG. 7A, a flex tape connection structure is shown, including a flex tape substrate 212 having a superficial conductive metal trace 210, affixed to a copper ground plane 214 having a ground ball pad 216 revealed in a ground via punched through the tape. A solder ball 200 has been formed in the via. The solder wets the superficial metal trace 210 at the interface 218, as is desired in this embodiment for connection between the trace and the ground ball; and the solder connects well with the pad 216 on the ground plane 216, as is desired. However, the solder does not wet the polyimide, and so a void is created at the interface 222 between the neck of the ground ball and the polyimide film. The via can be first filled with solder paste; but the solder paste produces gases during reflow, and if the metal trace surrounds the entire periphery of the via opening, then the gases cannot escape and undesirable voids result. This difficulty is overcome according to the invention by segmenting the metal trace at the periphery of the via opening, so that the metal reaches less than the entire perimeter of the via opening. In one embodiment, as shown for example in FIG. 7B, the metal trace 310 has the form of a number of spokes (four in this example) which reach less than about half the circumference of the via at the via opening 322, and portions of the polyimide film form the via opening between the spokes. The spokes can make good and sufficient contact with the solder ball at the via opening, and spaces between the solder and the polyimide film permit escape of gases to ambient at the via opening between the spokes during processing.

As noted above, singulation of the individual packages is facilitated according to the invention by forming slots in the laminated heat spreader and ground plane assembly, defining all four edges of the individual package and leaving the heat spreader and ground plane assembly for each package attached only by "ears" at the corners. This process is illustrated in FIGS. 6A and 6B. FIG. 6A shows generally at 170 a laminated strip dimensioned for simultaneous processing of five individual packages. Process holes 186 assist in automated alignment and register of the various layers. After the ground plane 180 has been laminated onto the heat spreader to form a ground plane—heat spreader assembly having die cavities 184, as described above with reference for example to FIG. 1, slots 192 and 194 are punched in the assembly to define the edges of the individual packages, leaving the individual ground plane—heat spreader assemblies connected to the strip by "ears" at the corners. Thereafter the remaining steps of package formation are carried out: lamination of the flex tape interconnect onto the ground plane, attachment of the die in the die cavity, wire bonding, encapsulation, and solder ball attachment. Once the packages are complete on the strip, the "ears" 194 are severed, for example by punching at the corners 195, as shown in FIG. 6B, and the singulated package is thereby freed from the strip. As will be appreciated, formation of the slots 190, 192 can ordinarily be carried out on the entire strip 170 at once; and the final singulation step of severing the "ears" 194 can ordinarily be carried out on all the packages at once. Advantageously, the "ears" provide a connection secure enough to permit ready handling of the strip during the process steps following slot formation, yet sufficiently small to permit the "ears" to be severed without applying great stress of force to the fully formed packages on the strip.

Other embodiments are within the following claims.

What is claimed is:

1. A semiconductor chip package, comprising a heat spreader, a ground plane affixed to the heat spreader, the heat spreader having a velvet type oxide on at least a surface of the heat spreader to which the ground plane is affixed, and a flex tape interconnect structure affixed to the ground plane, the interconnect structure comprising a patterned conductive trace on a flex substrate, wherein an aperture in the ground plane reveals a die attach surface on the heat spreader, and an aperture in the interconnect structure is aligned with the ground plane aperture such that the aligned apertures together with the revealed die attach surface define a die cavity, the aperture in the ground plane having walls formed so as to be substantially perpendicular to a ground plane surface, and the aperture in the interconnect being configured and dimensioned such that a marginal portion of the ground plane near the die cavity is revealed; wherein ground vias through the interconnect structure reveal ground ball attachment sites on the ground plane; and wherein the conductive trace is patterned so that the metal of the conductive trace reaches less than the entire periphery of a via.

2. The package of claim 1 wherein the ground plane is provided as a metal strip having a velvet type oxide on both an upper and lower surface.

3. The package of claim 1 wherein the heat spreader is provided as a copper strip and the velvet type oxide is a velvet black copper oxide.

4. The package of claim 1 wherein the flex tape interconnect structure comprises a two-layer tape.

5. The package of claim 1 wherein the flex tape interconnect structure comprises a three-layer tape.

6. The package of claim 1 wherein the flex tape interconnect structure comprises conductive traces formed from one metal layer.

7. The package of claim 1 wherein the flex tape interconnect structure comprises conductive traces formed from at least two metal layers.

8. The package of claim 1 wherein the metal of the conductive trace reaches no part of the periphery of at least one ground via.

9. The package of claim 8, further comprising a solder mask on the conductive traces, the solder mask being patterned to reach no part of the periphery of the ground via.

10. A package structure, comprising a heat spreader, a ground plane affixed to the heat spreader, the ground plate having a velvet type oxide on at least a surface by which the ground plane is affixed to the heat spreader, and a flex tape interconnect structure affixed to the ground plane, the interconnect structure comprising a patterned conductive trace on a flex substrate, wherein an aperture in the ground plane reveals a die attach surface on the heat spreader, and an aperture in the interconnect structure is aligned with the ground plane aperture such that the aligned apertures together with the revealed die attach surface define a die cavity, the aperture in the ground plane having walls formed so as to be substantially perpendicular to a ground plane surface, and the aperture in the interconnect structure being configured and dimensioned such that a marginal portion of the ground plane near the die cavity is revealed; wherein ground vias through the interconnect structure reveal ground ball attachment sites on the ground plane; and wherein the conductive trace is patterned so that the metal of the conductive trace reaches less than the entire periphery of at least one ground via.

11. The package of claim 10 wherein the heat spreader is provided as a metal strip having a velvet type oxide on the surface to which the ground plane is affixed.

12. The package of claim 10 wherein the ground plane is provided as a copper strip and the velvet type oxide is a velvet black copper oxide.

13. The package structure of claim 10 wherein the metal of the conductive trace reaches no part of the periphery of at least one ground via.

14. The package structure of claim 13, further comprising a solder mask on the conductive traces, the solder mask being patterned to reach no part of the periphery of the ground via.

15. The package of claim 10 wherein the flex tape interconnect structure comprises conductive traces formed from at least two metal layers.

16. The package of claim 10 wherein the flex tape interconnect structure comprises a two-layer tape.

17. The package of claim 10 wherein the flex tape interconnect structure comprises a three-layer tape.

18. A method for forming a plurality of packages, by providing a metal heat spreader strip, a metal ground plane strip, and a flex tape interconnect structure, wherein the metal strips and the interconnect structure are dimensioned so that a plurality of individual packages are constructed together on the strip and then are singulated to make the several individual packages, wherein the ground plane strip and the interconnect structure each are provided with an opening for each of the several packages;

laminating the ground plane onto the heat spreader to form a heat spreader—ground plane assembly;

forming slots in the laminated heat spreader—ground plane assembly, such that each of the four edges of each package is defined by a slot, and such that each package remains connected to the strip by its four corners;

laminating the interconnect substrate onto the ground plane such that the openings in the ground plane and the interconnect substrate are aligned such tat the walls of each opening together with the part of the underlying heat spreader that is exposed within them defines a die cavity, the opening in the interconnect substrate being configured and dimensioned such that a marginal portion of the ground plane near the die cavity is revealed, and such ground vias through the interconnect structure reveal ground ball attachment sites on the ground plane, a conductive trace on the interconnect structure being patterned so that the metal of the conductive trace reaches less than the entire periphery of at least one ground via;

attaching a die in the die cavity;

forming wire bonds from the die to bond fingers at selected contact points on conductive traces in the interconnect structure and at points on the exposed marginal portion of the ground plane;

encapsulating the die and the wire bonds;

attaching solder balls to sites on conductive traces in the interconnect structure;

attaching solder balls through the ground vias to the ground ball attachment sites on the ground plane;

and then severing the connecting corners of the individual packages to singulate the packages.

19. The method of claim 18 wherein the metal of the conductive trace reaches no part of the periphery of at least one ground via.

20. The method of claim 19, further comprising forming a solder mask on the conductive traces, the solder mask being patterned to reach no part of the periphery of the ground via.

* * * * *